United States Patent [19]

Miller

[11] Patent Number: 5,866,436
[45] Date of Patent: Feb. 2, 1999

[54] PROCESS OF MANUFACTURING AN INTERGRATED CIRCUIT HAVING AN INTERFEROMETRICALLY PROFILED MOUNTING FILM

[75] Inventor: Anton Johann Miller, Allentown, Pa.

[73] Assignee: Lucent Technologies Inc., Murray Hill, N.J.

[21] Appl. No.: 454,976

[22] Filed: May 31, 1995

Related U.S. Application Data

[60] Division of Ser. No. 285,458, Aug. 3, 1994, abandoned, which is a continuation-in-part of Ser. No. 163,462, Dec. 7, 1993, abandoned.

[51] Int. Cl.⁶ .......................... H01L 21/48; H01L 21/56; H01L 21/58; H01L 21/301
[52] U.S. Cl. .............. 437/225; 437/228; 148/DIG. 135; 156/636.1
[58] Field of Search .................... 437/228 ST, 228 POL, 437/228 PL, 974, 225, 946; 148/DIG. 135; 156/636.1

[56] References Cited

U.S. PATENT DOCUMENTS

| | | | |
|---|---|---|---|
| 4,512,113 | 4/1985 | Budinger | 51/236 |
| 4,758,533 | 7/1988 | Magee et al. | 437/173 |
| 4,874,463 | 10/1989 | Koze et al. | 156/645 |
| 5,196,353 | 3/1993 | Sandu et al. | 437/8 |
| 5,222,329 | 6/1993 | Yu | 51/165.77 |
| 5,254,830 | 10/1993 | Zarowin et al. | 219/121.43 |
| 5,332,467 | 7/1994 | Sune et al. | 156/636 |
| 5,433,651 | 7/1995 | Lustig et al. | 451/6 |
| 5,452,953 | 9/1995 | Ledger | 356/382 |
| 5,486,129 | 1/1996 | Sandu et al. | 451/5 |

Primary Examiner—David Graybill

[57] ABSTRACT

A method of improving the yield and achievable tolerances of integrated circuits by obtaining surface measurements of non-reflective soft mounting films used in integrated circuit manufacture. The non-reflective surface of a mounting film is first rendered reflective by applying a reflective wafer atop the film surface. This reflective test wafer, which is highly plano-parallel and preferably has a thickness less than that of the ultimate product wafer, is applied to the mounting film to be measured via direct pressure whereby the reflective test wafer conforms to and takes on the surface characteristics and contours of the film. The formerly non-reflective surface of the mounting film is thereby rendered effectively reflective and thus susceptible to optical profiling and graphical and numerical recordation by a computerized interferometer in accordance with well-known techniques. The mounting film may then be critically applied during integrated circuit manufacture, during initial wafer forming and/or during chemo-mechanical polishing for layer planarization.

5 Claims, 15 Drawing Sheets

FIG. 3A-1
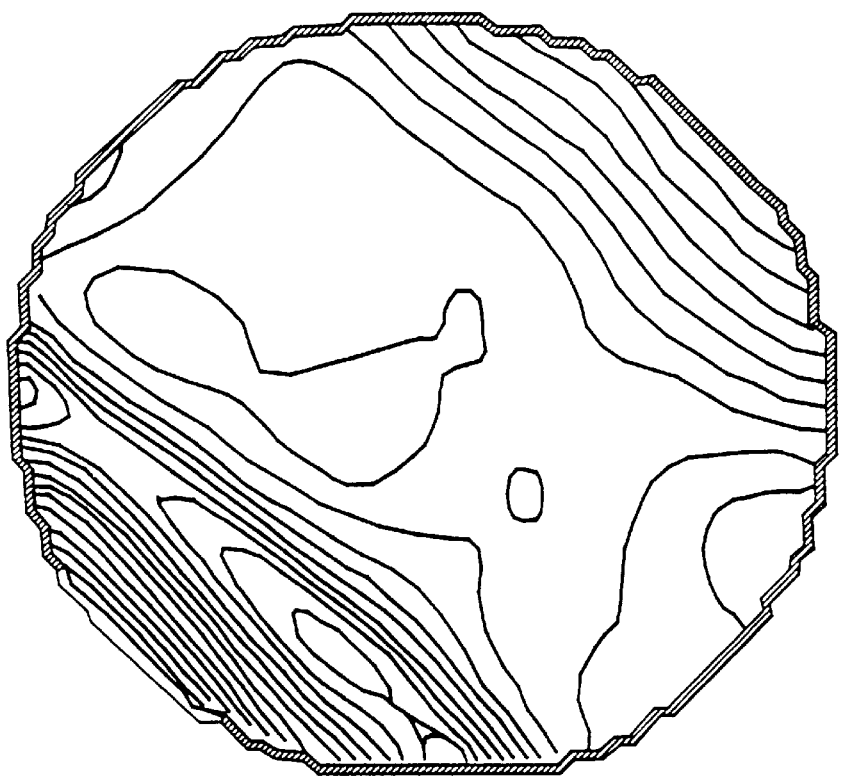
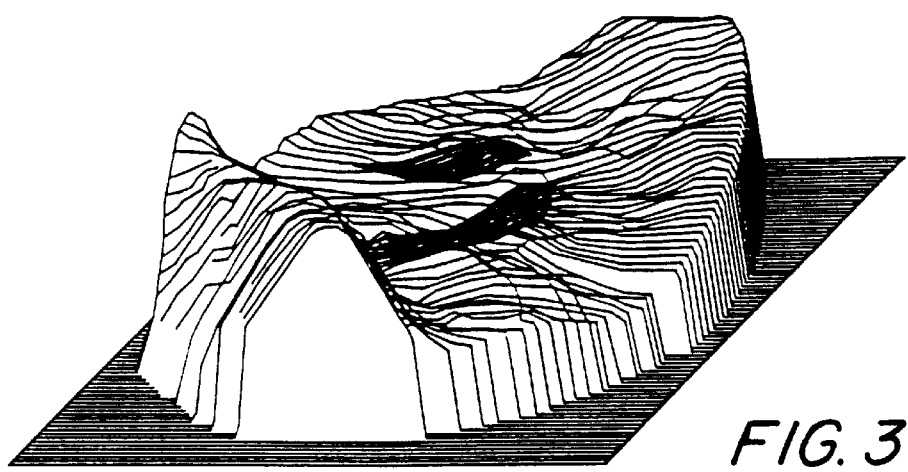
FIG. 3A-2
SCALE 1.00 μm / CONTOUR
TOTAL INDICATED READING 14.5 μm
FOCAL PLANE DEVIATION  −7.7 μm SCALE 1.00 μm / CONTOUR
TOTAL INDICATED READING 20.4 μm
FOCAL PLANE DEVIATION  −10.3 μm

FIG. 3C-1
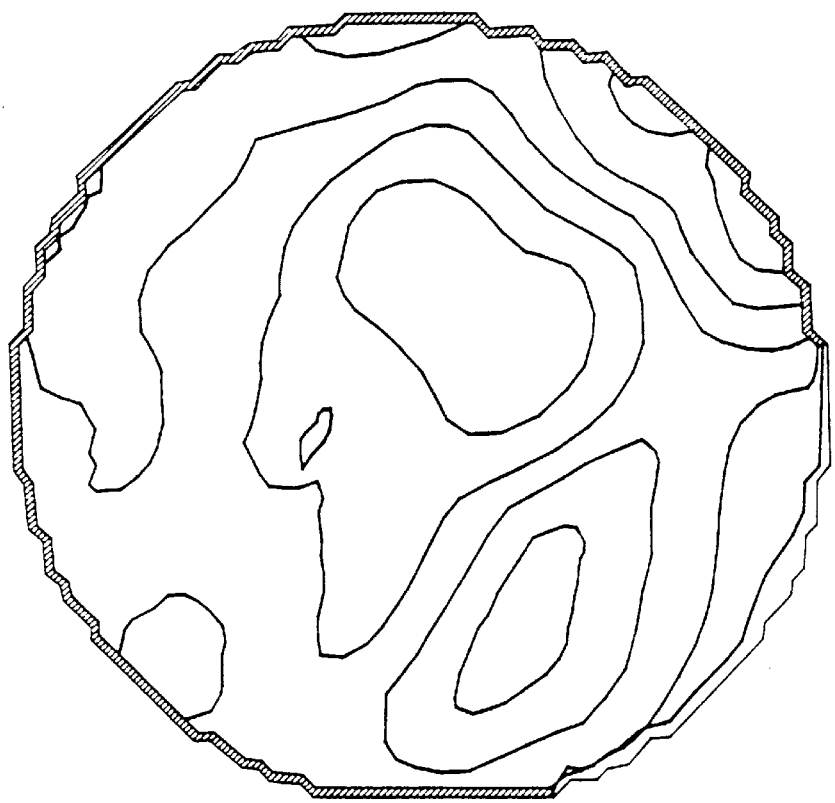
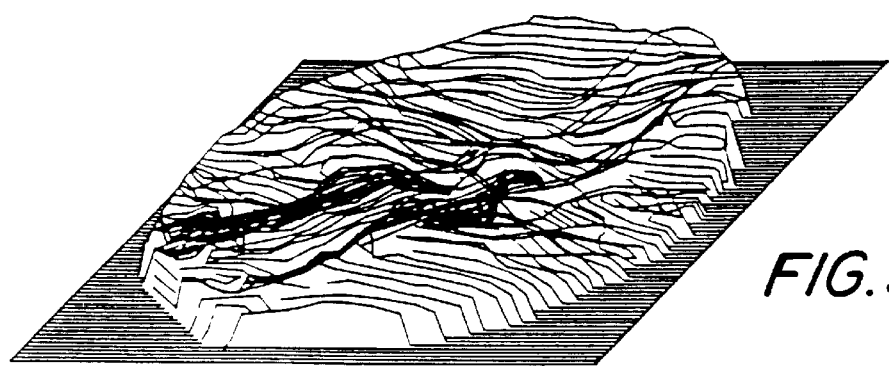
FIG. 3C-2
SCALE 1.00 μm / CONTOUR
TOTAL INDICATED READING  5.8 μm
FOCAL PLANE DEVIATION    3.3 μm

FIG. 3D-1
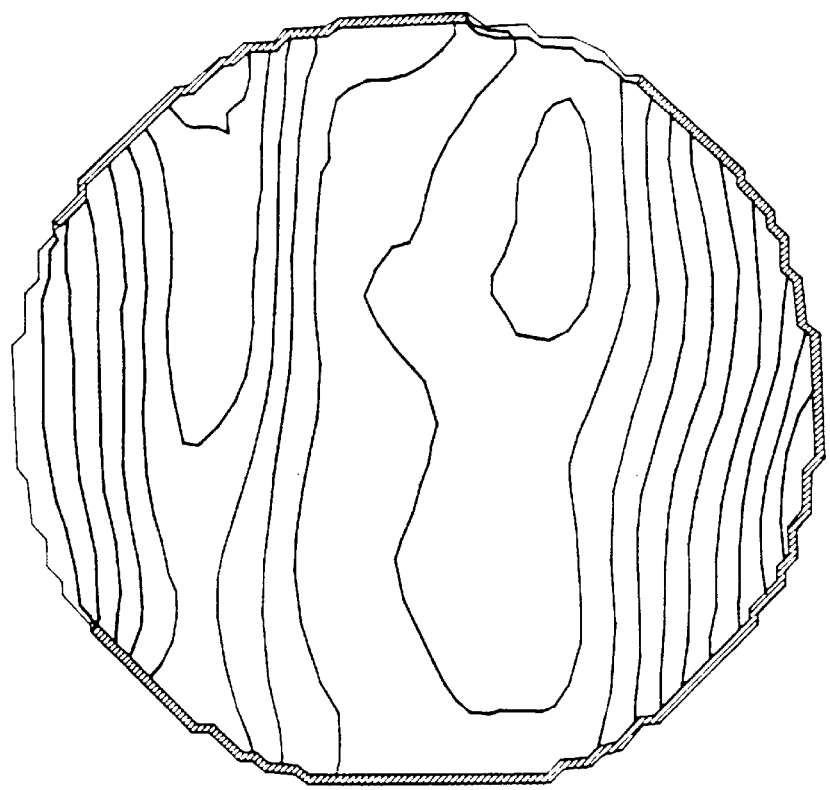
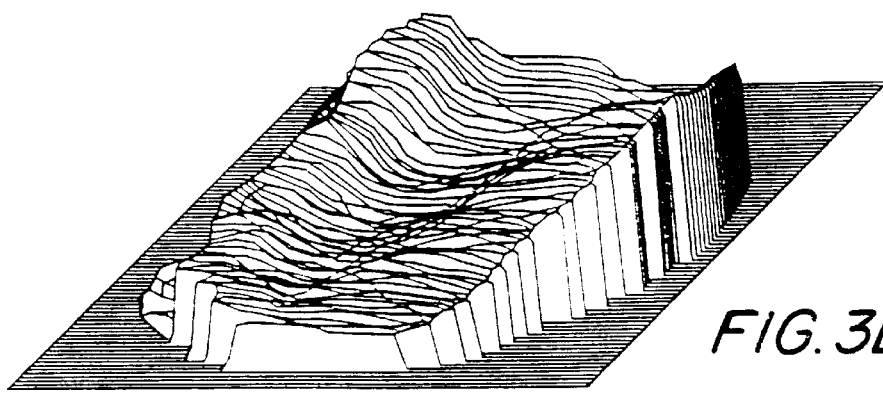
FIG. 3D-2
SCALE 1.00 μm / CONTOUR
TOTAL INDICATED READING 11.5 μm
FOCAL PLANE DEVIATION  8.1 μm SCALE 1.00 µm / CONTOUR
TOTAL INDICATED READING  5.0 µm
FOCAL PLANE DEVIATION    3.0 µm SCALE 1.00 μm / CONTOUR
TOTAL INDICATED READING  6.8 μm
FOCAL PLANE DEVIATION    3.7 μm FIG. 4C-1
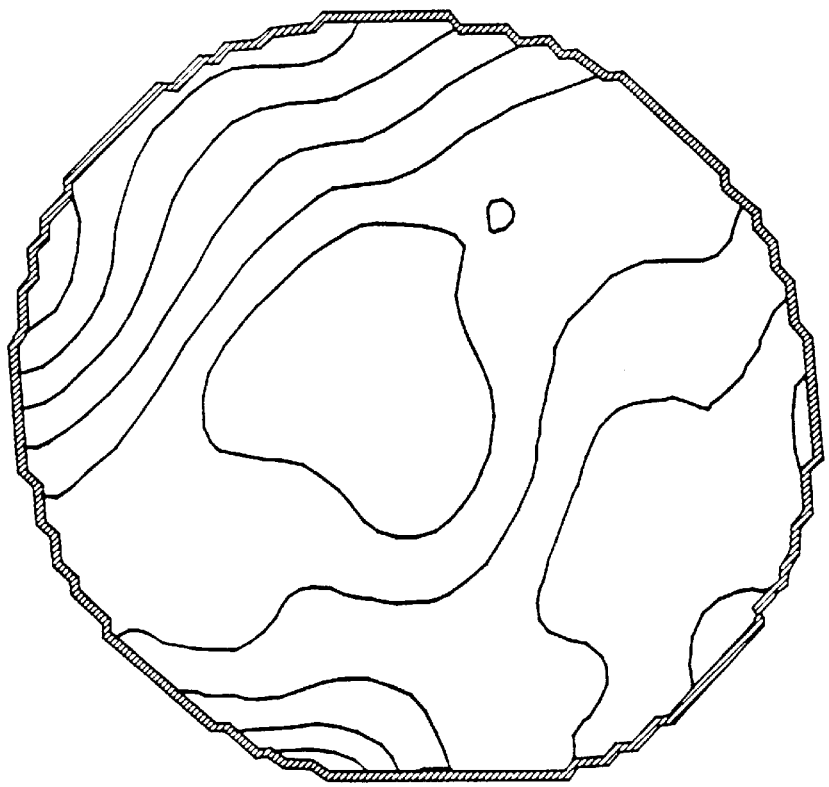
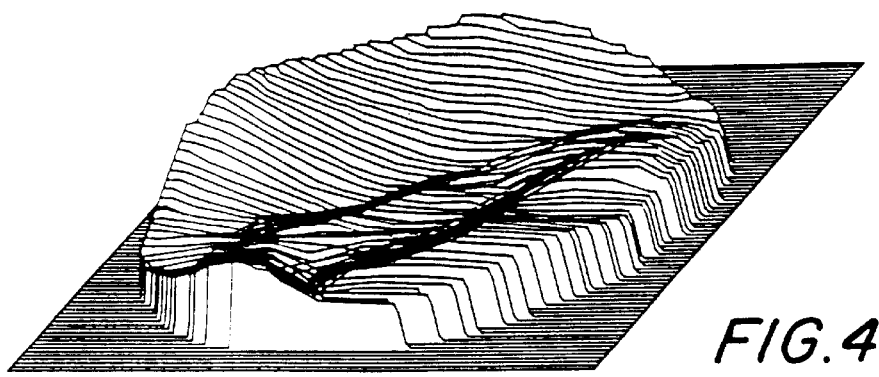
FIG. 4C-2
SCALE 1.00 μm / CONTOUR
TOTAL INDICATED READING 6.6 μm
FOCAL PLANE DEVIATION 4.3 μm

FIG. 4D-1
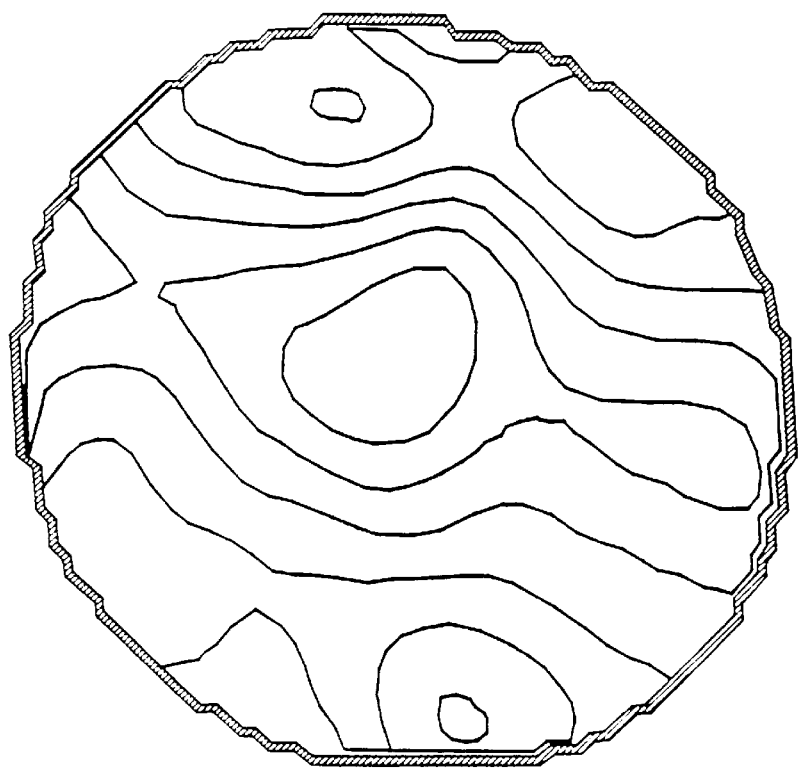
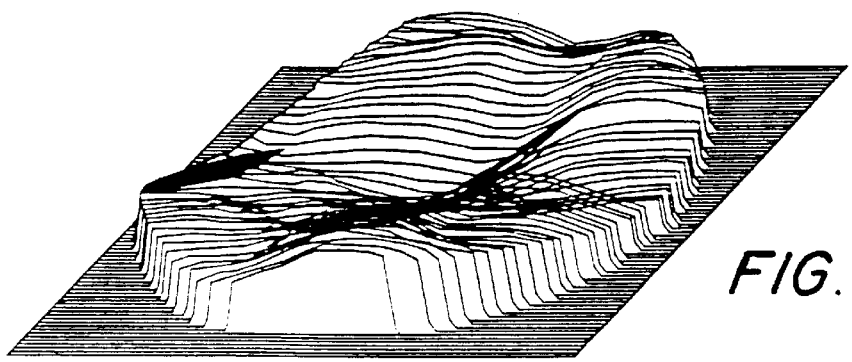
FIG. 4D-2
SCALE 1.00 μm / CONTOUR
TOTAL INDICATED READING 6.1 μm
FOCAL PLANE DEVIATION  −3.3 μm SCALE 1.00 μm / CONTOUR
TOTAL INDICATED READING 10.5 μm
FOCAL PLANE DEVIATION  −6.2 μm SCALE 1.00 μm / CONTOUR
TOTAL INDICATED READING  8.7 μm
FOCAL PLANE DEVIATION    5.2 μm

FIG. 5C-1
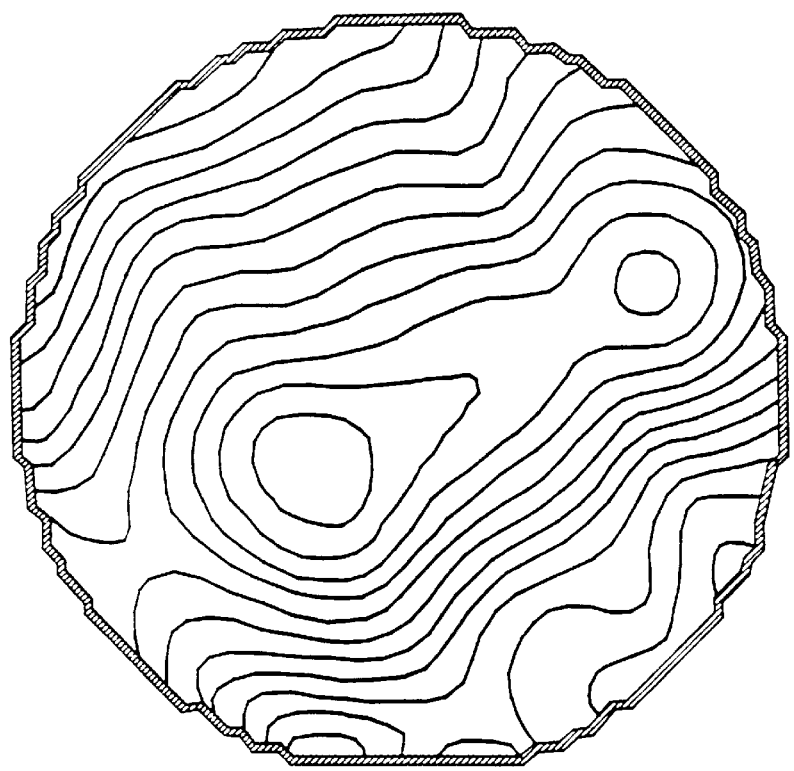
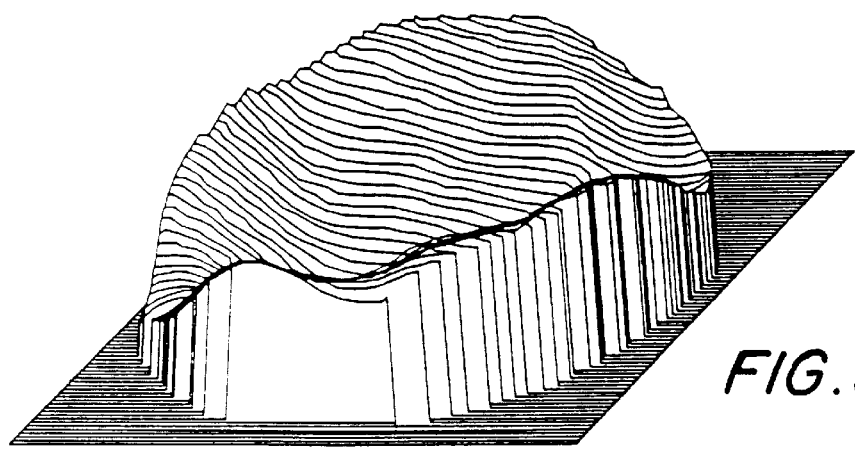
FIG. 5C-2
SCALE 1.00 μm / CONTOUR
TOTAL INDICATED READING 12.6 μm
FOCAL PLANE DEVIATION    6.6 μm FIG.5D-1
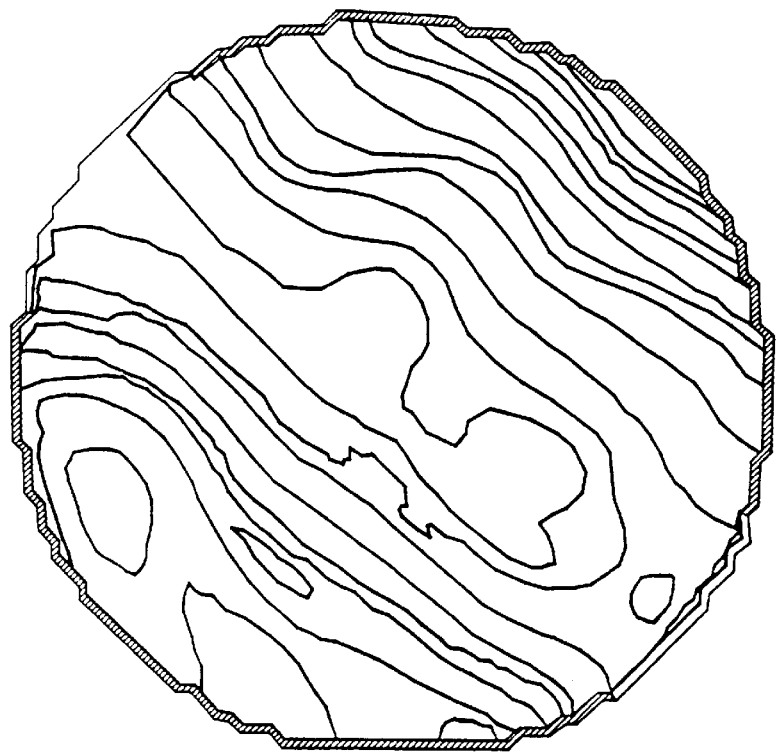
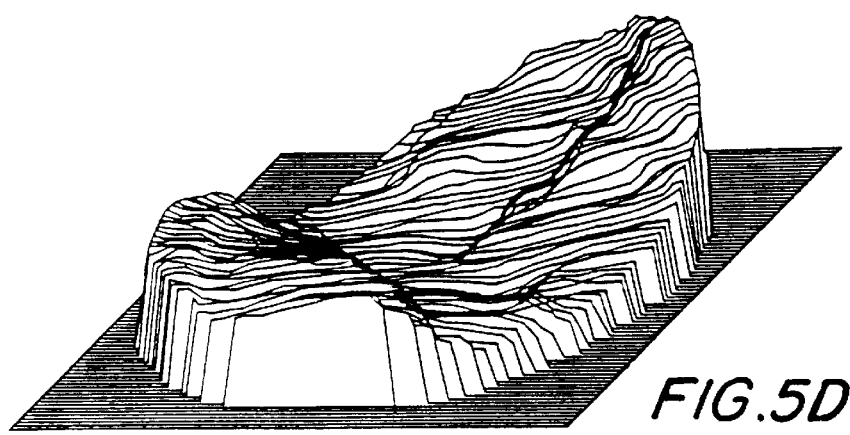
FIG.5D-2
SCALE 1.00 μm / CONTOUR
TOTAL INDICATED READING 12.9 μm
FOCAL PLANE DEVIATION    8.8 μm

PROCESS OF MANUFACTURING AN INTERGRATED CIRCUIT HAVING AN INTERFEROMETRICALLY PROFILED MOUNTING FILM

CROSS-REFERENCE TO RELATED APPLICATION

This is a division, of application Ser. No. 08/285,458, filed Aug. 3, 1994 abandoned, which was a continuation-in-part of Ser. No. 08,163,462 filed Dec. 7, 1993, now abandoned.

FIELD OF THE INVENTION

This invention is directed to improvements in the manufacture of integrated circuits, specifically through improvement in the processes used to prepare the semiconductor materials used in the manufacture of such integrated circuits. It relates to a method for determining surface characteristics, such as flatness and shape, of soft mounting films typically used to support semiconductor wafers during the wafer polishing process and in other wafer-related processes. As applied, the method enables selection and use of only those films meeting preselected criteria, i.e. critical flatness requirements, so as to ensure that the desired flatness characteristics of the wafers ultimately mounted on such films can be readily obtained. The inventive method may be applied to improve the yield and reduce the costs of manufacturing integrated circuit chips formed from semiconductor wafers subjected to chemo-mechanical polishing, and/or to improve the uniformity of surface layers in the planarization of such wafers. Integrated circuits thus obtained may be, for example, microprocessors, logic chip arrays, CMOS DRAMs, and other multilayer products.

BACKGROUND OF THE INVENTION

During the manufacture of integrated circuits (ICs), and especially in the process of wafer polishing for very large scale integration (VLSI) applications—either as the last step in wafer shaping or, further downstream, in chemo-mechanical polishing (CMP) for layer planarization—the achievement and/or maintenance of a high degree of wafer planarity is of utmost importance.

The achievement of optimal wafer flatness, both in the initial forming of the wafer and after initial forming during CMP, directly impacts yield and overall manufacturing costs, since wafer flatness is fundamental to achieving desired focal conditions during the various lithographic printing steps applied during IC manufacture. This is especially true for advanced, e.g. 0.35 $\mu$m or less, technologies. The high yields required for today's competitive IC manufacturing can only be achieved if optimal focal conditions over the whole wafer are obtained.

Success in achieving or maintaining planarity depends on a variety of conditions such, for example, as initial wafer flatness from lapping and etching, the polishing process itself, the type of machine utilized in the process, and many other machine and operator related variables. Also affecting the IC end product are the consistency, type and uniformity of the consumables employed in the polishing process.

Among the consumables employed during wafer processing are the polishing pad, the slurry and, most importantly, the soft polymeric mounting film that the wafer is attached to and held by, usually via capillary attraction or friction, during the polishing process. Among the most critical parameters of the process are the flatness and shape of this mounting film.

Depending upon the process employed, the mounting film may be unattached or laminated to other structures, usually to a plastic film material such as "MYLAR" or fiberglass-epoxy based materials. The film may have a high, medium or low compressibility and wafer-holding ability, depending upon its pore size, density, thickness, surface condition or other treatments applied. In several commonly known forms the mounting film may have a pressure sensitive adhesive backing for ease of use and quick attachment to a wafer carrier. The general properties and use of such films are known, and described elsewhere, for example in U.S. Pat. No. 4,512,113 to Bodinger.

In IC manufacturing applications utilizing mounting films of this type, if the film is not uniformly compressible, is overly or insufficiently compressible, is not sufficiently flat, is incomplete, or is otherwise defective, the ultimately-required wafer flatness—or layer uniformity in CMP planarization—cannot be achieved. Ideally, in order to achieve a desired wafer flatness or layer uniformity the flatness of a mounting film assembly should be equal to or better than the required wafer flatness. The present invention flows from a recognition that the flatness of mounting films in current use often does not approach that ideal condition.

Presently, the flatness characteristics of mounting films—sometimes referred to in the industry as qualifications—are most often obtained from information provided by the manufacturer, since the films are typically sold in batches on the basis of a single thickness measurement taken at a representative point on the film; this is commonly known as thickness sorting. Such thickness sorting exhibits a significant drawback in that it does not take into account thickness variations across the entire surface of interest of the mounting film, and neither does it address thickness variations imposed by the mounting film assembly that is used as an associated part of the overall wafer preparation process.

Another conventionally-practiced method is to obtain the required flatness information subjectively after the wafer has been processed—i.e. after polishing—by testing the wafer flatness (or the layer uniformity in CMP). This measured result is then related to the actual conditions of the mounting film. Unfortunately, this measurement is most often arrived at after numerous wafers have already been polished and rejected. Another disadvantage of this technique is that it does not permit one to determine whether, or to what extent, variables other than the flatness of the mounting film are responsible for the substandard wafer surface.

It has become increasingly apparent that low yields in the flatness of certain wafer lots can be and often are directly related to variations in the surface characteristics of the mounting films used in wafer processing. Yet to date there exists no satisfactory way to obtain critical surface measurement of wafer-carrying mounting films to determine whether the film meets preselected, application specific flatness criteria . Currently known mechanical surface measuring techniques are unable to measure the entire surface of the subject film with sufficient precision due at least in part to the softness of the film itself. Moreover, direct optical measurement of mounting films of interest using interferometry is currently impossible due to the almost total non-reflectivity of these mounting films.

There is accordingly an urgent and critical need for a method of testing the flatness and other critical surface characteristics of the mounting films used in wafer processing and IC manufacture prior to actual production of the wafer end product so as to increase the yield of usable wafers, and thereby improve productivity, by identifying deficient mounting films before they are employed in the wafer production process.

As applied to IC manufacture, the above-referenced ability to cull mounting films in accordance with design-dependant, pre-selected parameters yields superior results during initial wafer forming and chemo-mechanical polishing, resulting in an improvement in the ability to meet critical IC design tolerances, especially in processes requiring design parameters of 0.35 μm or less. Integrated circuit devices thus obtained may be, for example, microprocessors, logic chip arrays, CMOS DRAMs, and other single or multilayer products.

Such a method would also be of great value to film suppliers as a tool for enhanced thickness sorting and qualification, as well as for measuring improvements in the manufacture of these films.

SUMMARY OF THE INVENTION

In recognition of the above-identified need, there has been developed a novel method of testing the flatness and shape of polymeric, soft mounting films typically used in wafer processing. The inventive method may be applied to all wafer sizes, either before or after attachment to a carrier. The method enables numerical qualification of the entire mounting film surface area of interest through known optical measurement techniques utilizing, by way of example, computerized interferometers.

Once so measured, if the mounting film meets certain preselected criteria relative to the flatness requirements of the particular IC manufacturing process employed, that mounting film is then used in the further processing of the wafer into an IC chip, particularly, but not necessarily, in the step of chemo-mechanical polishing. Thus, the semiconductor wafers and/or any layers formed upon those wafers which are polished utilizing such films are of improved flatness. It will be recognized by one skilled in the art that surface flatness plays an important role in the ultimate quality of the integrated circuit produced, since the resolution obtainable in the lithographic steps carried out to form circuit elements on the wafer are directly dependant on the surface flatness of the semiconductor workpiece. Such lithography operations are well known in the art, and are particularly critical as applied to advanced, e.g. 0.35 μm or less, IC manufacturing technologies.

To obtain such measurements, the non-reflective surface of the mounting film is first rendered reflective by the application thereto of a thin, highly plano-parallel reflective wafer. The reflective wafer is formed using, by way of example, a known method of achieving highly plano-parallel wafers such, for example, as the method, described in U.S. Pat. No. 4,874,463 to Koze and Miller, the entire disclosure of which is incorporated herein by reference. This reflective, highly plano-parallel wafer, which generally has a thickness less than that of the ultimate product wafer, is applied to the mounting film to be measured via direct pressure. The attached reflective wafer, referred to herein as the test wafer, thereby conforms to and takes on the contours of the surface of the film. In this way the formerly non-reflective surface of the mounting film, through the direct-contact and pressurized application of the test wafer, is rendered reflective and thereby susceptible to optical measurement. The test wafer conforms to and retains the contours of the surface of the film for a sufficiently long period of time as to permit the mounting film to be readily measured and graphically profiled, and those measurements numerically recorded, by a computerized interferometer in accordance with known techniques. Once that measurement is completed and the mounting film surface parameters determined, the test wafer is removed for repeated use and the film may then be utilized in wafer processing in the usual manner.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF THE DRAWINGS

In the drawings, wherein like reference characters denote similar elements throughout the several views:

FIGS. 3A-1 through 3D-2 depict the results of surface measurement tests of one type of surface film in accordance with the present invention;

FIGS. 4A-1 through 4D-2 depict the results of surface measurement tests of another type of surface film in accordance with the present invention;

FIGS. 5A-1 through 5D-2 depict the results of surface measurement tests of still another type of surface film in accordance with the present invention;

DETAILED DESCRIPTION OF THE PRESENTLY PREFERRED EMBODIMENTS

Figure 1:
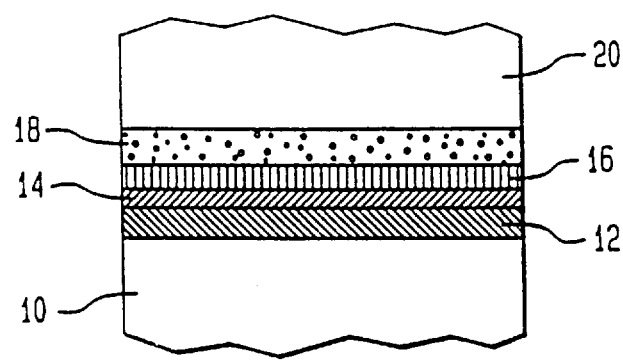
FIG. 1 is a sectional side view depicting a reflective test wafer being pressed onto a mounting film surface in accordance with the present invention.
Figure 6A:
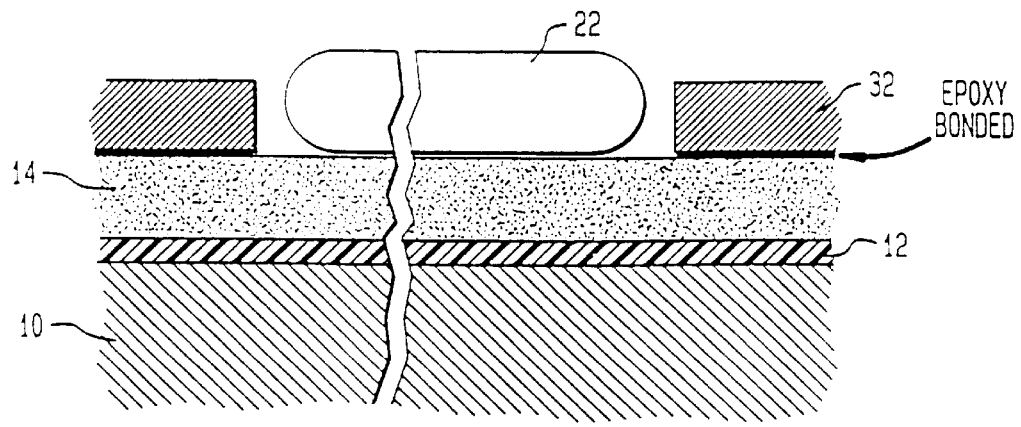
FIGS. 6A through 6C depict the relationship of the mounting film, carrier and product wafer workpiece using heretofore known wafer processing techniques.
Figure 6B:
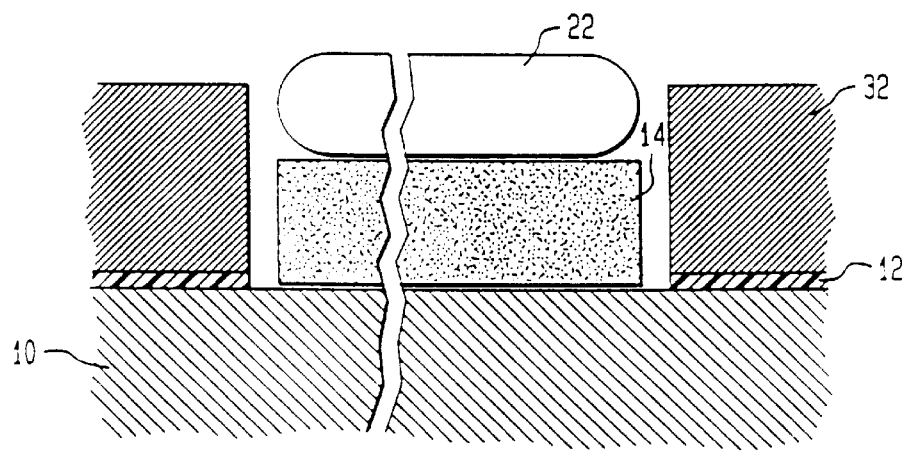
Figure 6C:
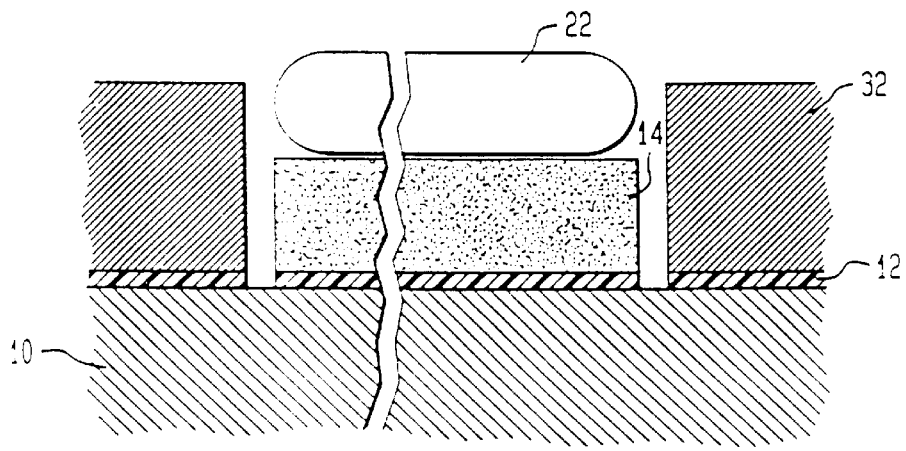

With initial reference to FIG. 1, there is depicted a sectional side view illustrating the relationship among the component elements utilized in accordance with the inventive method herein described. A mounting film 14 to be measured is placed upon a carrier 10. It is contemplated that the mounting film 14 be of the type that a product wafer workpiece is placed upon during currently known methods of wafer processing such, for example, as wafer polishing for VLSI applications as the last step in wafer shaping or in CMP for layer planarization. The current generation of such films are commonly referred to as soft polymeric mounting films. It will nevertheless be recognized that the inventive method may also be employed for determining the surface characteristics of many other types of underlying mounting films, without regard to the particular wafer processing technique ultimately utilized. FIGS. 6A through 6C respectively depict three currently well-known and conventionally-practiced arrangements for mounting a product wafer, or workpiece, on a mounting film 14 for wafer polishing or processing.

Returning to FIG. 1, the mounting film may be affixed to the carrier via an adhesive 12, such adhesive techniques being heretofore known in the art. The presence or absence of an adhesive is, however, a general matter of design choice and is typically dependent upon the particular wafer processing application in which the mounting film 14 will ultimately be employed.

Once the mounting film 14 has been secured as desired to the carrier 10, a thin reflective test wafer 16 is positioned atop or upon the mounting film in the same manner as a product wafer 22 would be positioned for normal polishing or processing of the wafer 22. The test wafer 16 has a reflective surface capable of reflecting the illuminator beams utilized in interferometric test measuring apparatus so that the test wafer surface may be readily interferometrically profiled.

The test wafer 16 may be fabricated of the same material as a product wafer 22—so long as it is sufficiently reflective—but is preferably notably thinner. Product wafers in present use generally have thicknesses in a range of approximately 625 to 725 $\mu$m. The test wafer 16 should preferably be as thin as possible while still permitting practical handling and use in the inventive method herein disclosed. While no specific actual lower limit of test wafer thickness is either contemplated or intended, the presently preferred thickness range is approximately 200 to 500 $\mu$m, with a thickness in the 200 to 300 $\mu$m range being most preferred at this time. The thickness of the test wafer may even approach or equal that of the product wafer, as will be further discussed below, but at greater thicknesses further steps must be taken to enhance the adhesion, and therefore the conformance, of the test wafer to the film surface.

With further reference to FIG. 1, after the test wafer 16 has been positioned atop the mounting film 14, it is pressed against the surface of the mounting film with sufficient force, and for a sufficient duration, to affix the test wafer to the mounting film 14 and to cause the test wafer 16 to conform to the configuration or contours of the supporting surface of the mounting film 14. The presently preferred force or pressure is typically in the range of approximately 1 to 10 pounds per square inch (psi), applied for a duration of at least approximately 1 second and generally not exceeding 10 seconds. Variations in pressure and duration—both within and beyond the preferred ranges—may be made to suit the individual requirements of the materials or machines in use, and are readily within the ambit of the skilled practitioner. The pressure is applied using a pressure tool 20, typically in the form of a rigid, flat disk, although its overall shape is not critical to the method provided it has at least one sufficiently flat surface with which to press upon the test wafer. The pressure tool 20 may be formed of metal, plastic or any other material capable of being machined flat and able to withstand the pressures being applied in accordance with the invention.

Between the pressure tool 20 and the test wafer 16 there is interposed a pressure pad 18. The pad 18 is preferably formed of a soft, resilient material which, when pressed between the pressure tool 20 and test wafer 16, will transfer the pressure from the pressure tool 20 to the test wafer surface and cause the test wafer to adhere and conform to the surface contours of the mounting film 14 without damaging either article. The pressure pad 18 may be a closed cell foam rubber pad, a wafer polishing pad, or other suitably resilient material of that general type.

Figure 2:
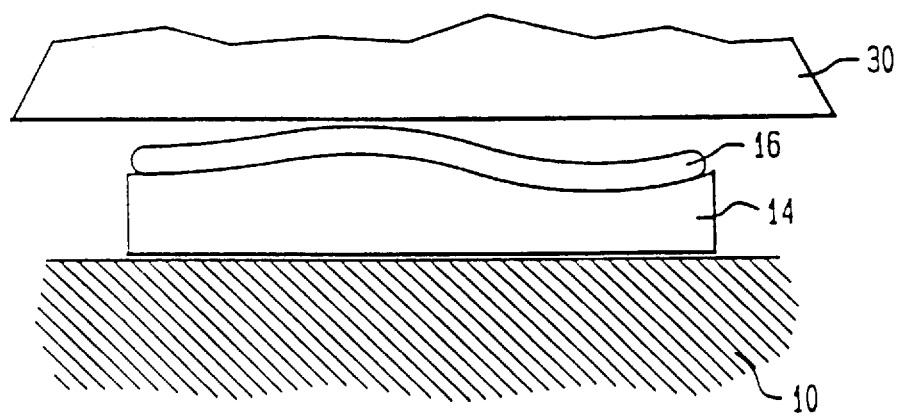
FIG. 2 is a sectional side view depicting the relationship of elements during interferometric measurement in accordance with the present invention.
Figures 1, 3B:
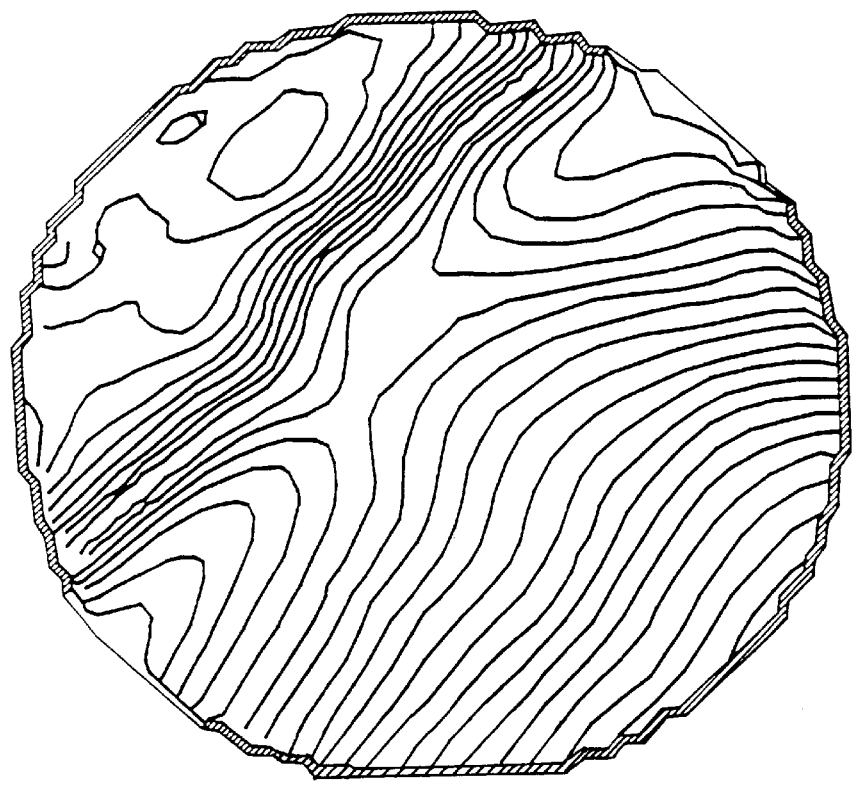
Figures 2, 3B:
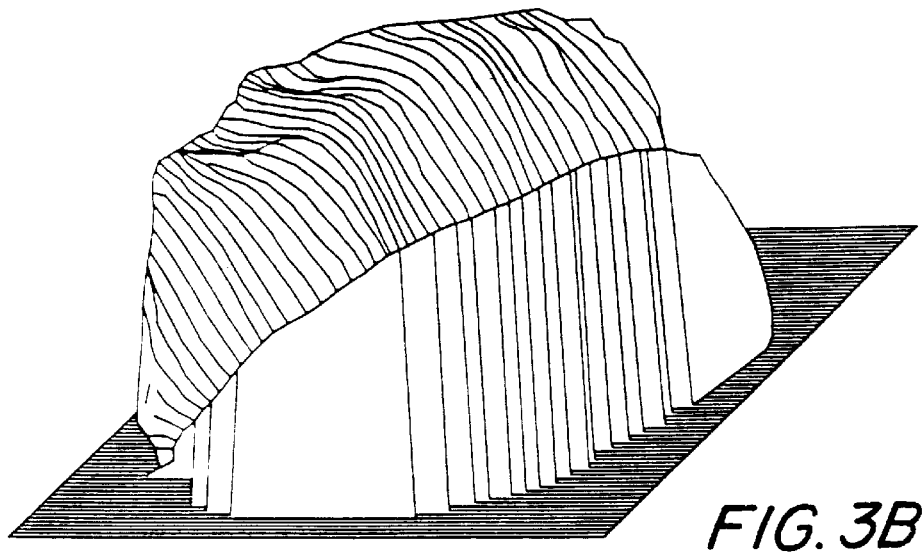
Figures 1, 4A:
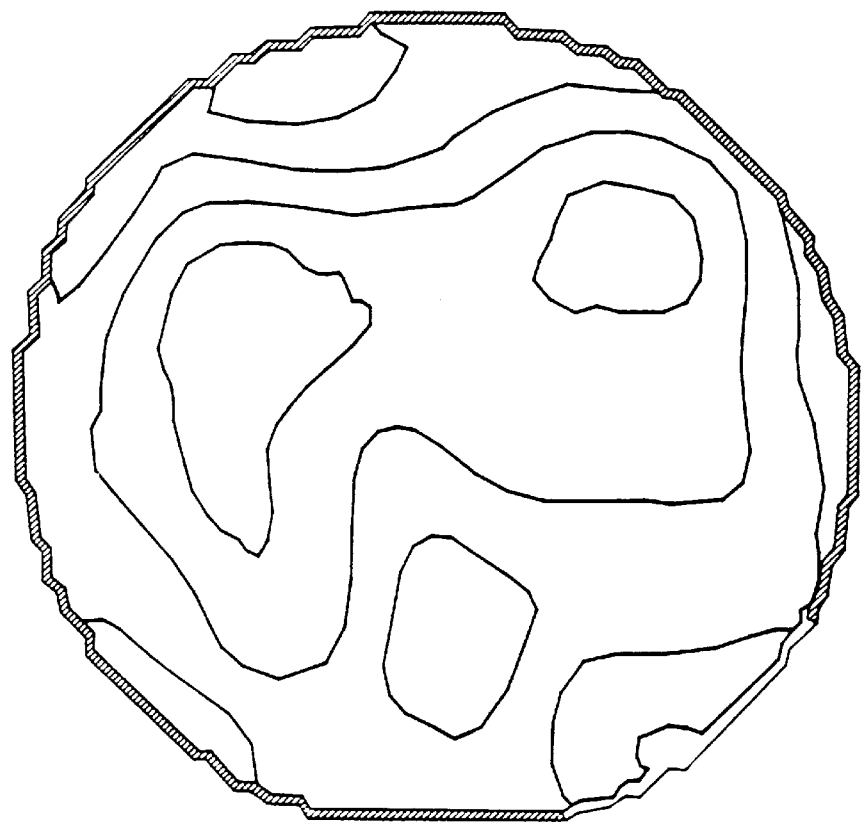
Figures 2, 4A:
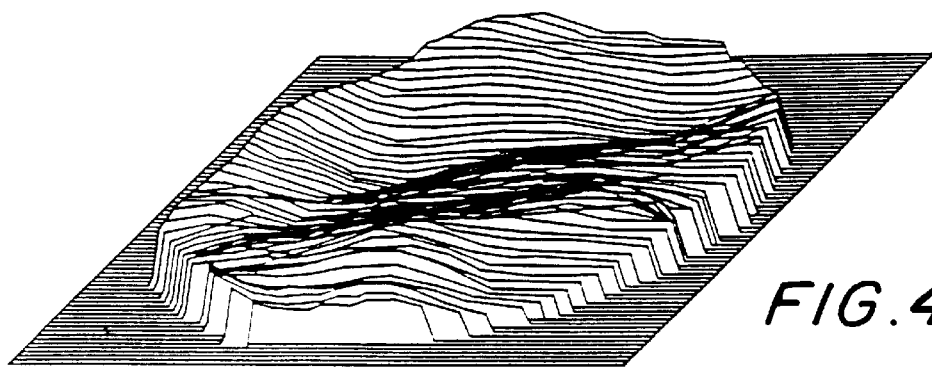
Figures 1, 4B:
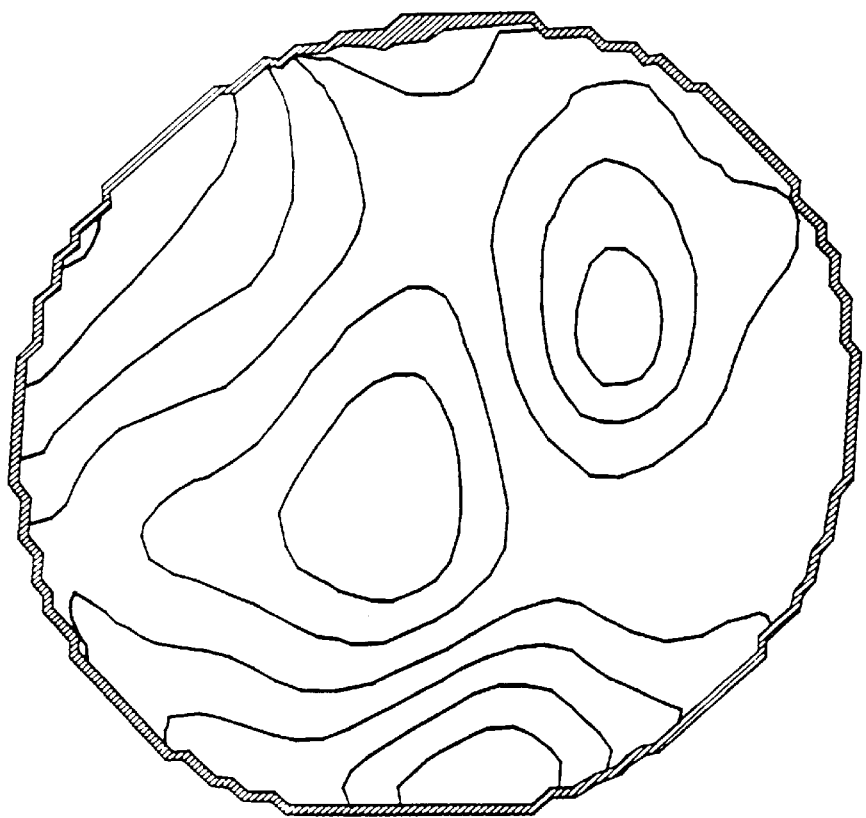
Figures 2, 4B:
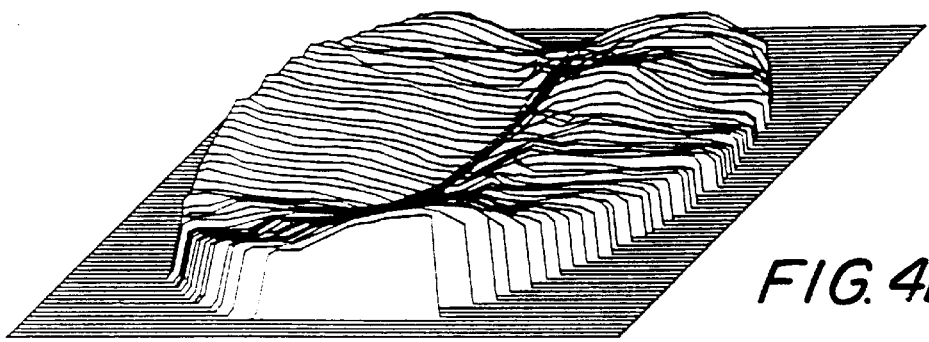
Figures 1, 5A:
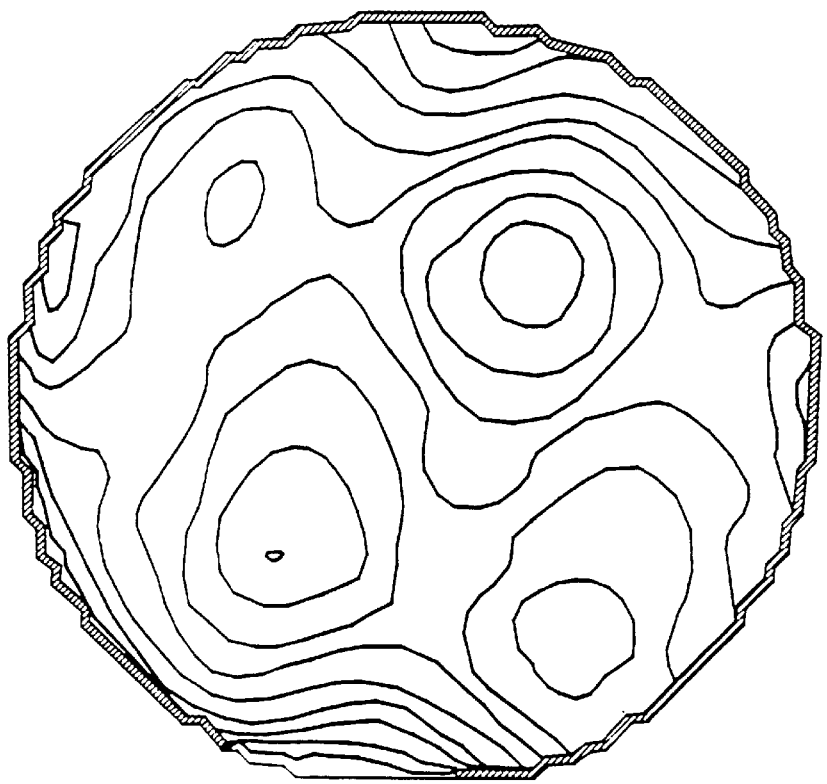
Figures 2, 5A:
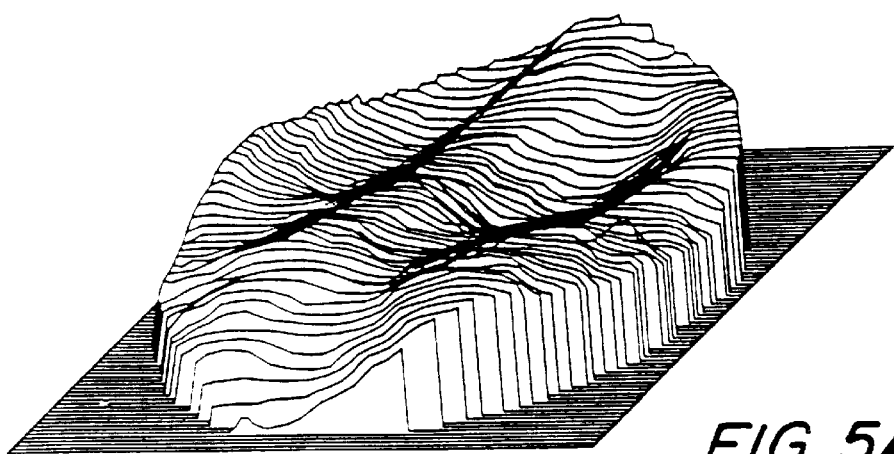
Figures 1, 5B:
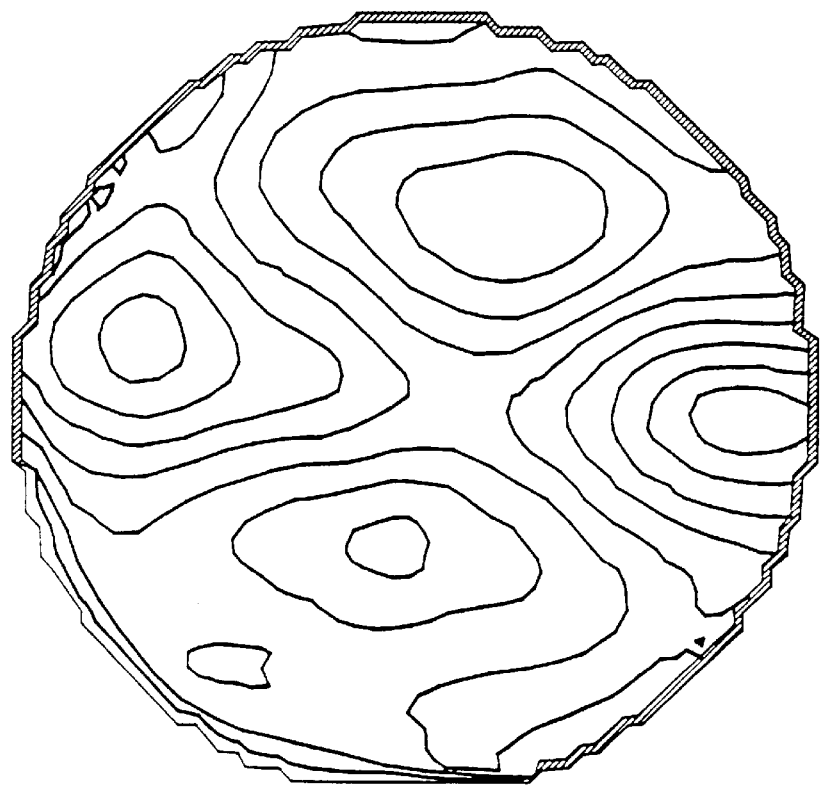
Figures 2, 5B:
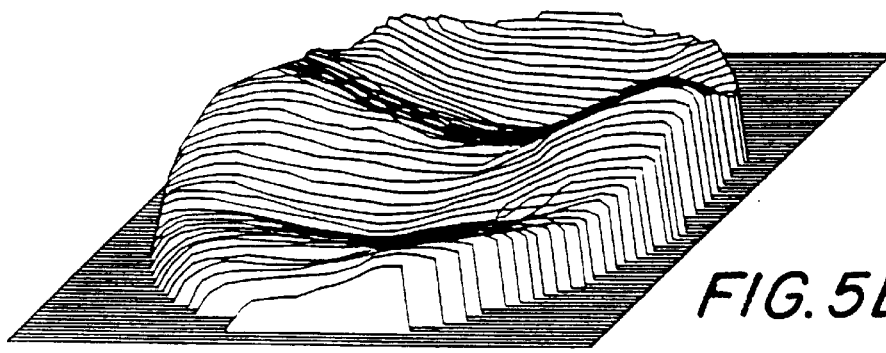

After the pressure has been applied to the test wafer 16 for the selected period of time at the selected pressure, the pressure pad 18 and pressure tool 20 are removed. The applied pressure will have caused the test wafer 16 to conform, that is to assume the shape or configuration or contours of, the surface of the mounting film 14, thereby forming on the mounting film surface a reflective layer having the same configurational characteristics as does the mounting film 14 itself. A measurement of the surface profile of the reflective layer is therefore closely representative of the like characteristics of the underlying mounting film 14. This conforming of the test wafer to the mounting film can be seen in FIG. 2 which depicts, in exaggerated detail, the relationship of the test wafer 16 and mounting film 14 after the two components have been pressed together. The test wafer 16, being affixed to and configurationally conforming to the surface characteristics of the mounting film 14, provides a reflective surface that may then be measured using computerized interferometry apparatus and the like in accordance with techniques well known in the art.

The thinness of the test wafer 16 permits and results in its extremely close conformance to the surface characteristics of the mounting film 14 being measured. Thus, measurements of the reflective surface contours of the test wafer 16 yield a substantially true and precise image of the flatness of the mounting film surface which, heretofore, was not measurable by interferometric techniques due to its effective non-reflectivity, i.e. a reflectivity approaching zero. The application of the test wafer 16 to the non-reflective surface of the mounting film 14 in accordance with the present invention essentially renders the surface of the mounting film 14 reflective and thereby susceptible to precise profiling or measurement by known interferometric techniques.

Referring once more to FIG. 2, the mounting film 14 bearing the affixed test wafer 16 is positioned on a carrier 10 beneath an interferometer reference surface 30, and computer assisted interferometric measurements in accordance with appropriate techniques well known or otherwise available in the art are carried out on the surface of the reflective test wafer. The resultant measurements yield an accurate representation of the surface contours of the mounting film and thereby enable reliable determination of whether the mounting film meets the critical flatness characteristics required for wafer processing, such as wafer polishing or layer planarization.

It will be recognized by those skilled in the art that the method and measurements herein described may be applied as part of a control process for the initial selection of mounting films to be used in wafer processing. They may also be applied during a continuous wafer production process wherein initial measurements are taken to determine the usability of the mounting film, wafers are then processed as desired, and further measurements are thereafter taken to determine whether the mounting film, after a certain amount of use, still meets the critical flatness requirements or, alternatively, must be replaced.

Wafers polished upon the flat mounting films selected in accordance with the present invention may then be fabricated into integrated circuits using lithography techniques well known in the art.

By way of further description, the following examples demonstrate typical applications and implementations of the invention.

EXAMPLE 1

Floating Insert

Figure 7A:
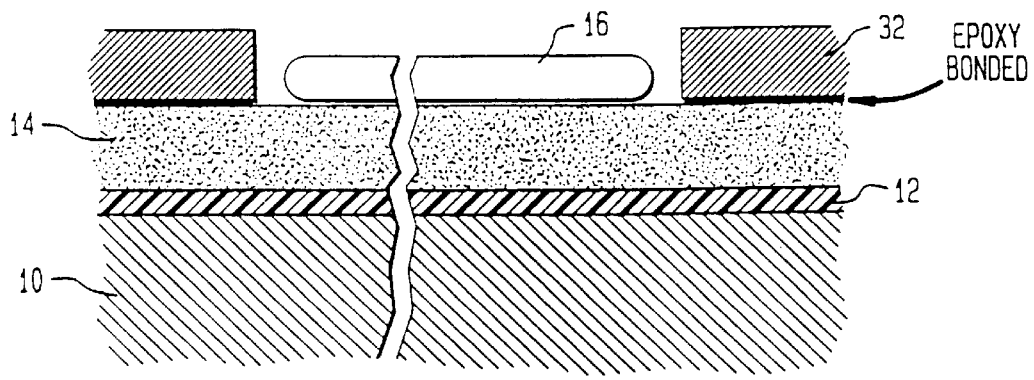
FIGS. 7A through 7C depict the relationships between the reflective test wafer, mounting film and carrier in accordance with the method of the present invention.
Figure 7B:
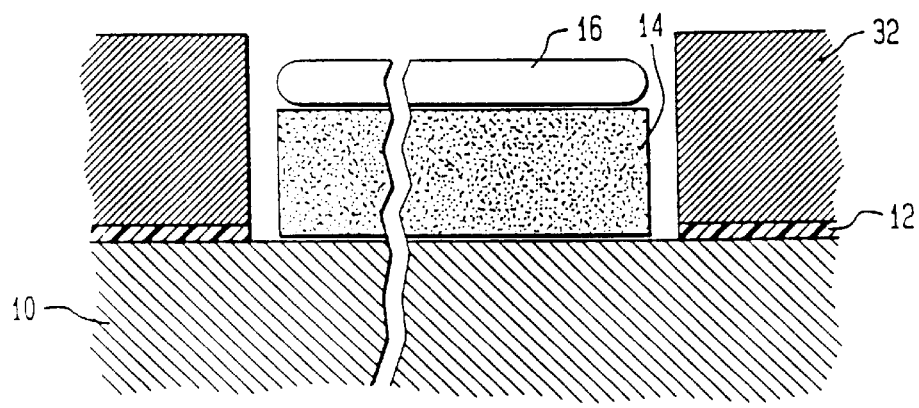

The method of the invention was applied to determine surface characteristics of soft mounting films provided in the form of floating inserts, i.e. mounting film on mylar without an adhesive backing, as depicted in FIGS. 6B and 7B. The insert was wetted with de-ionized water and the test wafer was centered atop the insert. Capillary action held the wafer in place during transfer to a vacuum chuck attached to an interferometer. A flat, round disk of approximately 15 mm thickness and of the same diameter as the test wafer was covered on one side with a wafer polishing pad, such as an embossed "SUBA 500" pad. With the pad contacting the wafer and the vacuum of the chuck in the "on" position, the disk was pressed on the wafer in the manner described herein above. Profiling of the test wafer surface by conventional interferometric techniques was carried out to yield a numerical record and three-dimensional (3D) graph of the overall shape and flatness of the mounting film and the correspondingly contoured affixed test wafer. FIGS. 3A-1 through 3D-2 show the interferometrically-measured profiles of four different inserts tested after application of the inventive method herein described. As can be seen from those figures, the different inserts varied widely in surface flatness, yielding total indicated readings (TIR), also known as nonlinear thickness variations (NTV), in a range from approximately 5.8 to 20.4 µm.

EXAMPLE 2

Template Assembly

When utilized as an element of a template assembly, the mounting film forms a part of a multilayer lamination. The film, also mounted on mylar, covers the entire carrier as depicted in FIGS. 6A and 7A. Carriers are commonly 12" or 14" in diameter. Affixed, as with an epoxy adhesive, atop the film is the actual template with openings or nest holes provided for retention of the wafer during polishing. The template assembly is attached to the carrier with a pressure sensitive adhesive. For testing the film flatness within each nest hole, one thin test wafer per opening was attached to the film in each nest hole as previously described in Example 1 except that the vacuum chuck was replaced by the carrier. The carrier was then brought into contact with the reference surface of the interferometer. Because of the reduced thickness of the test wafer only the template made contact with the interferometer reference surface. The template, formed of nonabrasive materials, has a clean and relatively smooth surface and therefore will not damage the otherwise sensitive face of the interferometer. If desired, thin standoffs appropriately attached to the interferometer reference surface or to the template may be employed to further protect the reference surface without influencing the accuracy of the test. Moreover, the interferometer may have a built-in arrangement to provide an adjustable space between the reference surface and the test wafer or template. FIGS. 4A-1 through 4D-2 and FIGS. 5A-1 through 5D-2 show the resultant numerical values and 3D graphs of the interferometrically profiled flatness of the several template assemblies tested in accordance with the inventive method.

The method herein disclosed may also be applied to fixed inserts, i.e. inserts provided with an adhesive backing, or in any other application requiring the affixing of a wafer to a mounting film where the surface characteristics of the mounting film are important or critical to the quality of the end product wafer produced. The method of the present invention, when applied to such inserts, provides the advantage of allowing multiple insert conditions to be readily and accurately tested. For example, one may determine not only the flatness and shape of the insert but, in addition, variations in the adhesive layer and the quality of attachment of the insert to the carrier. The quality of attachment can seriously suffer by any entrapment of air, voids and/or particles or burrs on the edges of the "MYLAR" to which the insert is affixed. The presence of these quality-affecting conditions is easily revealed by the method of the invention. Moreover, the ability to apply the inventive method to inserts after their attachment to a carrier is significant. A carrier can thereby be tested as a single unit and then released for use in wafer processing, such as wafer polishing or CMP planarization, only after it has met its predetermined quality criteria. Furthermore, with periodic testing of carrier-born inserts after prolonged use, one may readily detect at what point during the wafer production process a given mounting film insert fails to meet predetermined quality criteria, hence requiring replacement.

Figure 7C:
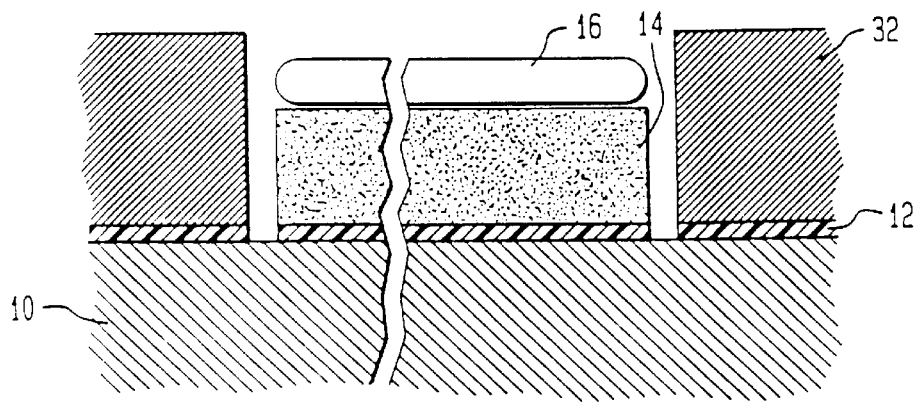

The appropriate positioning of the wafer and mounting film when utilized as a part of a fixed insert assembly is shown in FIGS. 6C and 7C. There, the mounting film 14 is attached to the carrier 10 by a mounting adhesive 12. The mounting film is located within a retaining ring 32 which is similarly affixed to the carrier 10 by an adhesive 12. As in the implementation of the inventive method described above in Example 2, the retaining ring 32 of the carrier assembly contacts the interferometer reference surface. Since the retaining ring is formed of a nonabrasive material and has a smooth, clean surface, damage to the interferometer surface is avoided. Standoffs may also be provided as a further prophylactic measure without negatively impacting the accuracy of the test. Moreover, if so equipped, built-in arrangements in the interferometer for adjusting the space between the reference surface and the retaining ring may be employed.

While in its preferred embodiments the inventive method is practiced using thin test wafers, it is contemplated that test wafers approaching or even equalling the thickness of the product wafer may be utilized within the scope and spirit of the invention, so long as the thicker test wafers possess higher plano-parallelism than the ultimate product wafers, as discussed above. At greater test wafer thicknesses, however, the ability of the mounting film to attract and hold the wafer must be increased so as to enable the thicker test wafer to adhere to the mounting film with sufficient conformance and for a sufficient period of time to yield a meaningful determination of the surface characteristics of the film. This may be achieved through modifying of the inherent characteristics of the film itself, or by supplementing the de-ionized water with water-soluble, non-contaminating additives such, for example, as sugar, to increase its adhesive qualities. Alternatively, the de-ionized water may be replaced with other appropriate water soluble, non-contaminating liquids.

It can accordingly be seen that the method herein disclosed and described by reference to several preferred embodiments or applications may be utilized with many different mounting films and film mounting techniques to yield the critically important measurements and profile information necessary to determine whether a mounting film meets the surface characteristics and qualifications required for use in wafer processing.

Once such a determination is made, it is then possible to obtain wafers of improved flatness by polishing in accordance with known techniques, but using only those mounting films possessing the requisite surface characteristics and qualifications as determined in accordance with the present invention.

The flat wafers thus obtained are then utilized in the manufacture of integrated circuits utilizing lithography techniques well known in the art. Integrated circuits thus obtained may be of a wide variety, such as, for example, microprocessors, logic chip arrays, CMOS DRAMs, and other such single or multilayer devices.

Thus, while there have been shown and described and pointed out fundamental novel features of the invention as applied to various currently preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A method of manufacturing integrated circuits comprising the steps of:
   (A) selecting a workpiece upon which an integrated circuit is to be formed;
   (B) selecting a mounting film that has been interferometrically profiled to ensure that said mounting film satisfies preselected surface measurement criteria;
   (C) mounting said workpiece on the selected mounting film;
   (D) chemo-mechanically polishing said mounted workpiece; and
   (E) forming integrated circuit components on said chemo-mechanically polished workpiece.

2. A method according to claim 1, wherein the mounting film is a polymeric mounting film.

3. A method according to claim 1, wherein said step (E) comprises forming integrated circuit components on said chemo-mechanically polished workpiece so as to form an integrated circuit device.

4. A method according to claim 1, wherein said step (E) comprises forming integrated circuit components on said chemo-mechanically polished workpiece so as to form a VLSI integrated circuit device.

5. A method according to claim 1, wherein said step (E) comprises forming integrated circuit components on said chemo-mechanically polished workpiece so as to form a multi-layer VLSI integrated circuit device.

* * * * *